_United States Patent_ [19]

Fulton et al.

[11] 4,306,278

[45] Dec. 15, 1981

[54] SEMICONDUCTOR LASER ARRAY

[75] Inventors: James T. Fulton, Stamford, Conn.; Irwin M. Kaplan, East Northport, N.Y.

[73] Assignee: Grumman Aerospace Corporation, Bethpage, N.Y.

[21] Appl. No.: 814,082

[22] Filed: Jul. 8, 1977

Related U.S. Application Data

[63] Continuation of Ser. No. 616,264, Sep. 24, 1975, abandoned.

[51] Int. Cl.³ ............................................. F21V 13/00
[52] U.S. Cl. ............................. 362/259; 331/94.5 H; 331/94.5 P
[58] Field of Search ................ 362/259; 350/167, 190; 250/553; 331/94.5 D, 94.5 H, 94.5 P

[56] References Cited

U.S. PATENT DOCUMENTS

| | | | |
|---|---|---|---|
| 2,965,819 | 12/1960 | Rosenbaum | 317/234 A |
| 3,396,344 | 8/1968 | Broom | 331/94.5 D |
| 3,439,971 | 4/1969 | Van Vliet, Jr. | 350/96 T |
| 3,510,795 | 5/1970 | Winstel | 331/94.5 P |
| 3,518,419 | 6/1970 | Humphrey | 350/96 T |
| 3,541,374 | 11/1970 | Lidoski et al. | 313/108 |
| 3,600,063 | 8/1971 | Bowen | 350/190 X |
| 3,641,513 | 2/1972 | Picquendar et al. | 350/190 X |
| 3,655,986 | 4/1972 | Lax | 331/94.5 H |
| 3,670,260 | 6/1972 | Koester et al. | 350/167 X |
| 3,711,789 | 1/1973 | Dierschke | 331/94.5 P |
| 3,760,174 | 9/1973 | Boenning et al. | 331/94.5 P |
| 3,760,175 | 9/1973 | Gibson et al. | 331/94.5 P |
| 3,835,414 | 9/1974 | Ahern | 331/94.5 H |
| 3,835,415 | 9/1974 | Rutz et al. | 331/94.5 H |
| 3,922,074 | 11/1975 | Ikegami et al. | 350/167 X |

OTHER PUBLICATIONS

"Microelectronic Packaging", IBM Tech. Disc. Bull., vol. 12, #5, Oct. '69, p. 727.
"Integrated Cooling for High-Density Electronic Components", IBM Tech. Disc. Bull., vol. 14, #8, Jan. '72, p. 2532.
"Substrate Mounted Heat Pipe for Chip Cooling", IBm Tech. Disc. Bull., vol. 14, #9, Feb. '72, p. 2690.

Primary Examiner—Peter A. Nelson
Attorney, Agent, or Firm—Morgan, Finnegan, Pine, Foley & Lee

[57] ABSTRACT

An array of laser generating elements is mounted upon at least one substrate in a one-dimensional band, with essentially one laser emitting surface facing two lens assemblies, the first being an array of plano-cylindrical inner lenses, equal in number to the number of bands of laser elements with their focal axes parallel to such bands, and the second being a single plano-cylindrical outer lens having its focal axis perpendicular to those of the lenslets. Advantageously, the substrates are assembled such that each laser element is in essentially precise alignment with its corresponding lenslet for its preselected operating temperature. Also advantageously, the curved surfaces of each inner lens and of the outer lens are formed to a slightly acylindrical shape for essentially complete collimation of the laser radiation. Further advantageously, a heat removal system may be incorporated in the mounting substrate which is formed with an expanded rear face, having a coolant applied thereto. Moreover, an optical integrator may also be positioned between the laser emitting surface and the array of lenslets for generating a wider far field angle.

38 Claims, 13 Drawing Figures

SEMICONDUCTOR LASER ARRAY

This is a continuation of application Ser. No. 616,264 filed Sept. 24, 1975, and now abandoned.

BACKGROUND AND OBJECTS OF THE INVENTION

The present invention relates generally to solid state lasers and more particularly to doped or undoped semiconductor laser arrays operating at either room or reduced temperatures for obtaining higher power output and higher power density than heretofore obtained.

It has become well known that by the application of an electrical current to certain semiconductor diodes doped so as to contain a pn-junction, electromagnetic radiation or more particularly laser radiation is produced. For example, a simple gallium arsenide laser diode consists of a two-layer sandwich of semiconductor material, one layer being p-doped gallium arsenide and the second layer being n-doped gallium arsenide. The layers are positioned adjacent one another to provide a pn-junction from which, upon energization by an electric current passing therethrough, laser radiation is emitted. This may be accomplished by changing the deposit during deposition thereof to form a continuous gradient in the transition from the p-region to the n-region.

Typical laser diodes range from about 5 to 50 mils square, and about 5 mils thick. The laser light generated in the gradient between the layers emanates from a region which is between about 0.02 to about 0.08 mils thick. Various structures such as reflecting means may be included about the laser diode to allow the laser beam to emanate from only one edge thereof. Thus, the apparent laser source may be very elongated, about 5 to 50 mils long by about 0.02 to 0.08 mils high. Due to these dimensions and the non-homogeneities along the length of the pn-junction, the laser radiation is thereby emitted at a conical angle of approximately 20 degrees along two orthogonal axes.

Such laser producing diodes are being found useful in an increasing number of applications, for example, in cutting devices and range measuring systems. However, in many applications, a single laser diode is not sufficient to provide the required power intensity and, therefore, a laser source of much greater intensity is necessary. Generally, increased power can be achieved by using an array of multiple laser diodes which can be stacked and/or placed side by side. However, with such arrangements, two principal problems have been encountered. The emitted beams tend to diverge greatly and lose their intensity, while large amounts of heat are generated in the laser-active pn-junctions as well as in the neighboring regions of the semiconductor body due to the close proximity of diodes. The heat generated thereby may cause severe damage to the laser elements, especially when densely packed.

In order to minimize the loss in intensity of the laser beam due to beam divergence, systems of lenses, generally spherical, have been designed for focusing the beams of laser radiation. Although spherical lenses have been found adequate for some applications, it has been suggested that plano-cylindrical lens systems would enable the use of densely packed laser arrays for producing laser radiation of relatively high intensity. Among known lens system employing plano-cylindrical lenses, such as disclosed in U.S. Pat. No. 3,396,344 issued to Broom, an array of laser diodes is mounted to a suitable substrate in symmetrically arranged rows and columns, behind two groups of crossed plano-cylindrical lenses of relatively high collection angle (f/3 or greater), with the number of lenses in the inner group being equal to the number of vertical columns of laser diodes and the number of lenses in the outer group being equal to the number of horizontal rows of laser diodes. Although such systems have provided higher intensity laser radiation, they are generally incapable of generating well-defined or high quality laser beams because of the difficulties encountered in attempting to maintain precise alignment between the laser elements and their corresponding lenses at their operating temperatures, as well as the presence of one dimensional aberration—cylindrical aberration—analogous to spherical aberration experienced in spherical optics. In addition, the mounting of individual components of the size necessary to produce the requisite power density with individual screws, bolts, cams and pillow blocks becomes difficult if not impossible at packing densities approaching 500 or more laser diodes per square inch. Moreover, the use of a number of outer lenses of relatively long focal length and high collection angle corresponding to each individual laser limits both the packing density of the laser generating diodes and the mechanical packaging of the lens system. Furthermore, the use of fine adjustment means for aligning the system elements not only increases fabrication costs but also fails to adequately solve the alignment problem for higher intensity applications.

In order to remove the undesirable heat generated by the laser diodes, the laser generating elements are commonly mounted on a simple heat sink, or, as shown by U.S. Pat. No. 3,760,175 issued to Gibson et al., they may be mounted to the wall of a liquid coolant reservoir. However, as higher packing densities are achieved, removal of heat by such means becomes a severe limitation on performance as it cannot adequately accommodate the substantial amount of heat generated.

It is therefore an object of the present invention to provide a new and improved semiconductor laser array system.

Another object of the present invention is to provide a new and improved laser array system which is essentially permanently adapted for accurate optical alignment of the laser module elements at the pre-selected operating temperature of the system.

It is also an object of the present invention to provide an improved laser array system including acylindrical lenses which are essentially aberration-free and easily fabricated.

It is a further object of the present invention to provide an improved semiconductor laser array system capable of increased packaging density and both higher power output as well as higher average power output than heretofore achieved.

It is a further object of the present invention to provide an improved semiconductor laser array system which has a greater heat removal capacity than systems heretofore know to allow higher packing densities and operation at higher intensities.

It is another object of the invention to provide an improved semiconductor laser array capable of achieving substantially high peak and/or average power output in a narrower beam than heretofore available in a system having fewer parts and costing relatively less to fabricate.

It is still a further object of the invention to provide an improved semiconductor laser array having a heat removal system which allows continuous operation at any desired temperature irrespective of the output level of operation.

It is yet another object of the present invention to provide an improved semiconductor laser array capable of achieving an output power density per unit angle per unit source which is constrained only by the diffraction limit of the optics.

Objects and advantages of the invention are set forth in part herein and in part will be appreciated herefrom, or may be learned by practice of the invention, the same being attained and realized by means of the instrumentalities and combinations pointed out in the appended claims.

SUMMARY OF THE INVENTION

Briefly described, the semiconductor laser array system according to the present invention, comprises a plurality of laser diodes, or laser generating elements, mounted on substrates and preferably arranged in one-dimensional bands or rows having essentially one laser emitting surface. Advantageously, each row of laser elements is positioned behind and optically aligned with an inner plano-cylindrical lens having its focal axis parallel to its corresponding one-dimensional band of laser elements, and a single plano-convex outer lens having its focal axis perpendicular to those of the inner lens. Advantageously, each inner lens is of sufficiently wide lens aperture to capture substantially all the laser radiation which is emitted by its corresponding band of laser elements and which diverges in a plane perpendicular to its focal axis, and is sufficiently long to transmit essentially all the laser radiation emitted along the band length of laser diodes. Also advantageously, the outer lens is of sufficiently wide lens aperture to capture substantially all of the laser radiation transmitted by the lenticular lens array which diverges in a plane perpendicular to its focal axis and is sufficiently long to capture substantially all the laser radiation collimated by the inner lenses.

As preferably embodied, each row of laser elements is mounted to a substrate and the substrates are stacked symmetrically such that all the laser emitting surfaces define a common plane. Accordingly, all of the inner lenses may be formed from a single integral sheet of lens material to form a lenticular lens array. In addition, spacer elements may be provided between substrates for ensuring that the bands of laser elements are parallel and symmetrical and a frame may be positioned between the laser emitting surfaces and the lenticular lens array for spacing each inner lens from such surfaces by a distance equal to the focal length.

Furthermore, as preferably embodied, the substrates, spacers, the frame and lenticular lens array may be clamped together in a laser module such that when the system is operating at its pre-selected temperature range, each row of laser elements may be essentially precisely aligned with the focal axis of its corresponding inner lens, and the alignment is essentially permanently maintained by such clamping. In other words, due to the symmetry of all the elements and the high packing density of laser elements, the elements may be proportioned for precise alignment at the pre-selected operating temperature of the system, although misaligned for essentially all other temperatures, and fixedly clamped to maintain such alignment essentially permanently.

Also as preferably embodied, each lenslet of the inner lens array, as well as the outer lens, is formed to a slightly acylindrical shape in order to eliminate the one dimensional cylindrical abberrations generated by precisely cylindrical lenses. Moreover, an optical integrator may be positioned between the laser diodes and the lenticular lens array to provide a substantially wide field angle, or source size, and improved field uniformity.

Further advantageously, each substrate may be formed with an expanded rear surface to increase substantially the surface area thereof for dissipating heat generated by the laser elements, and a liquid coolant may be applied thereto, either by direct spraying or through the capillary action of a wick in contact therewith, for removing heat generated by the laser elements. As preferably embodied, the liquid coolant is of relatively low thermal capacity and evaporates essentially upon contacting the substrate such that the substrate is maintained substantially at the temperature of the boiling point of the coolant. As preferably embodied, the substrate may be formed in two mechanically connected parts, an "active" portion, upon which the laser diodes are mounted, comprising a laminated structure of alternating layers of high thermal-high electrical conducting material, on the one hand and highly electrically insulating material on the other, and a "passive" portion comprising a substrate member for positioning the laser diodes relative to the remainder of the system.

According to the present invention, it has been found that a semiconductor laser array may be constructed with relatively few parts to achieve a packaging density of between 500 and 600, or more, laser diodes per square inch. Furthermore, with the inexpensive and relatively simple optical system provided by the present invention, the increased power densities available from such packing of laser elements may be efficiently harnessed in a very narrow beam having a significantly lower beam angle diversion than in systems heretofore available. In addition, by clamping the substrates, spacers and the lenticular lens array together in a lenticular laser module wherein each row of laser elements becomes aligned with its corresponding lenslet of the lenticular lens array when subjected to its operating temperature, adjustment means are not required either for focusing laser beams or for precision alignment of elements with respect to each other. Moreover, the costs and complexity of fabricating each member of the laser module is significantly reduced due to the symmetry among part and the small number thereof, namely, the single outer lens and the lenticular lens array which may be fabricated from a single sheet of lens material. Furthermore, due to the acylindrical shaping of the lenses, it has been found that laser beam divergence may be reduced by a factor of about two or three over purely cylindrical lens systems, generating a very stable and high intensity far field pattern.

It has also been found that by the introduction of the lenticular optical tunnel between the laser diodes and the array of lenslets a laser beam may be generated having a relatively wide field angle in the vertical plane yet substantially uniform in radiant intensity.

It has further been found that the extensions formed on the rear face of the substrate and the selection of a coolant having a boiling point essentially equal to the operating temperature of the laser diodes, as hereinafter explained, provides an efficient cooling system which ensures that the laser diodes operate substantially at the selected operating temperature range. In addition, by constructing the supporting substrate with a laminate "active" portion, there is provided both a substantially unobstructed heat path between the laser generating elements and the coolant source as well as improved means for effecting electrical connection among all laser elements in each row, enabling a high packing density of laser elements.

It will be understood that the foregoing general description and the following detailed description are exemplary and explanatory of the invention but are not restrictive thereof.

The accompanying drawings, referred to herein and constituting a part hereof, illustrate preferred embodiments, serve to explain the principles of the invention.

BRIEF DESCRIPTION OF THE DRAWINGS

FIGS. 2b and 2c are enlarged top and side views, respectively, of the lens system illustrated in FIG. 2a.

FIG. 3b is an enlarged side view of the embodiment shown in FIG. 3a.

DETAILED DESCRIPTION OF PREFERRED EMBODIMENT

Figure 1A:
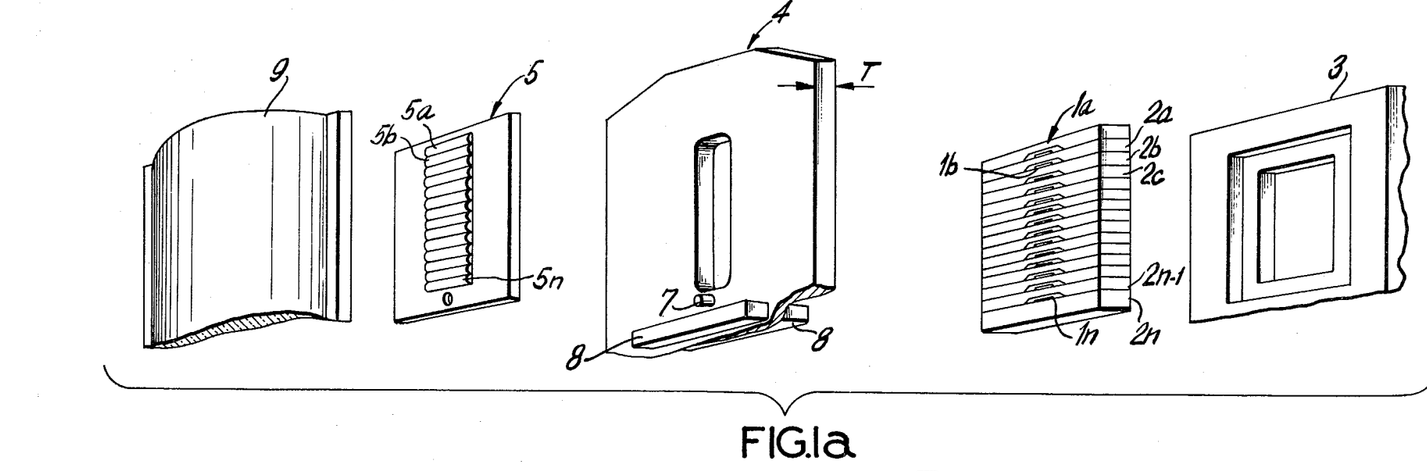
FIG. 1a is an exploded view of one embodiment of the laser array system according to the present invention.

Referring now to FIG. 1a, there is illustrated, in an exploded view, one embodiment of an improved semiconductor laser array system according to the present invention. Reference numerals $1a$, $1b$ ... $1n$, indicate horizontally extending rows or bands of laser generating elements, typically semiconductor laser diodes, although it will be understood that they may refer to vertically arranged single laser elements or that the rows may be arranged to extend vertically. However, for convenience, the illustrative embodiments of the present invention are described generally with reference to horizontally extending rows of laser elements. Accordingly, each row of laser elements, $1a$, $1b$, ... $1n$, is mounted to its corresponding substrate $2a$, $2b$, ... $2n$, respectively, for mechanical support and proper alignment, as hereinafter described. Advantageously, each substrate 2 may be formed with a step-like indentation (not numbered), in its lower front face in order to provide space for accommodating the row of laser elements 1 mounted to the top surface of the next adjacent substrate. Advantageously, with this indentation, the substrates 2 may be stacked on top of each other for effectively sealing or isolating the laser generating elements 1 from the direct influence of events occurring behind the substrates, such as, for example, the application of a coolant to the rear surface of the substrate, as hereinafter described. The laser elements may be electrically coupled for activation by any conventional method; typically, they are coupled in electrical series along each row. When connected in electrical series as hereinafter described, the laser system according to the present invention may include as many as 40 to 60 laser diodes per inch in each row, depending on the voltage required.

Each row of laser generating elements is advantageously arranged to extend in an essentially one dimensional band or row which is positioned behind a pair of crossed plano-cylindrical lenses. The first or inner lens, illustrated by the plurality of lenses $5a$, $5b$, etc., corresponding, respectively, to rows $1a$, $1b$, etc., has a relatively short focal length and is oriented with its focal axis parallel to its corresponding band of laser generating elements. The second or outer lens 9 has a longer focal length than that of said inner lens $5a$, etc., and is oriented with its focal axis perpendicular to that of the inner lens.

Advantageously, each inner lens, $5a$, $5b$, etc., is of sufficiently wide lens aperture to receive or capture substantially all of the laser radiation emitted by its corresponding row of laser elements and diverging in a plane perpendicular to its focal axis, and is sufficiently long to transmit substantially all of such laser radiation emitted along the entire row of laser elements. In addition, outer lens 9 is of sufficiently wide lens aperture to capture substantially all of the laser radiation transmitted by all of the inner lenses and diverging in a plane perpendicular to its focal axis, and is sufficiently long to capture substantially all of such laser radiation which has been collimated in one direction by the inner lenses. Accordingly, when more than one row of laser elements, e.g. rows $1a$, $1b$, etc., is included in the laser array, there is included an equal number of inner lenses, $5a$, $5b$, etc., in one-to-one correspondence with the rows of laser elements while only one outer lens is required for at least one of the rows and advantageously, as hereinafter described, for the entire system. Furthermore, it will be understood that when only one row, or one-dimensional band, of laser elements is employed, whether it be oriented vertically or horizontally, the laser array system according to the present invention may advantageously include only one inner lens having its focal axis parallel to such row and one outer lens having its focal axis perpendicular to that of the inner lens.

Although each row of laser elements may be positioned behind its own corresponding inner lens and its own corresponding outer lens, it is preferred that the rows of laser elements be positioned such that all of their laser emitting surfaces define a substantially common plane, and outer lens 9 may thereby be formed as a single lens for all of the rows of laser elements. Also advantageously, frame 4 may be positioned between the laser diode substrates and the rear surfaces of the inner lenses, and is formed to a thickness such that the essentially common plane of laser emitting surfaces is separated from the focal axis of its corresponding inner lens by a distance f equal to the back focal length of such lens (as illustrated in FIG. 2c).

Figure 1B:
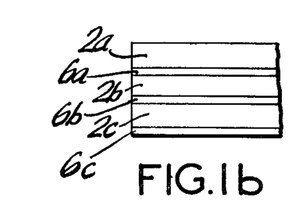
FIG 1b is a partial view of a mounting substrate system according to the present invention.
Figure 2A:
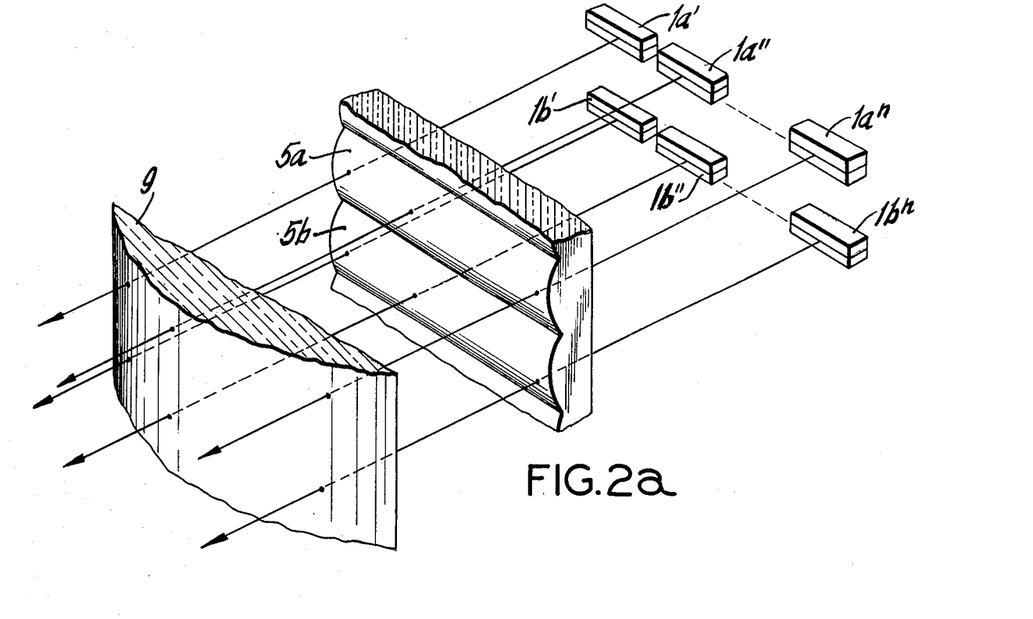
FIG. 2a is a partial view of a lens system according to one embodiment of the present invention.
Figure 2B:
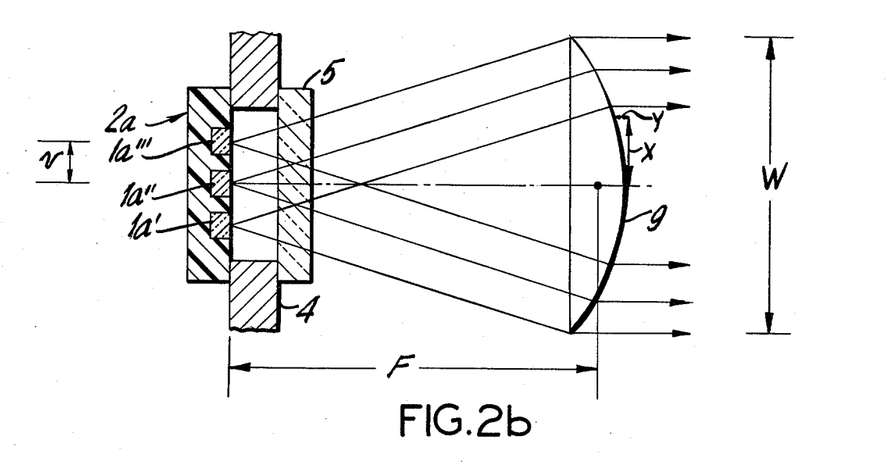
Figure 2C:
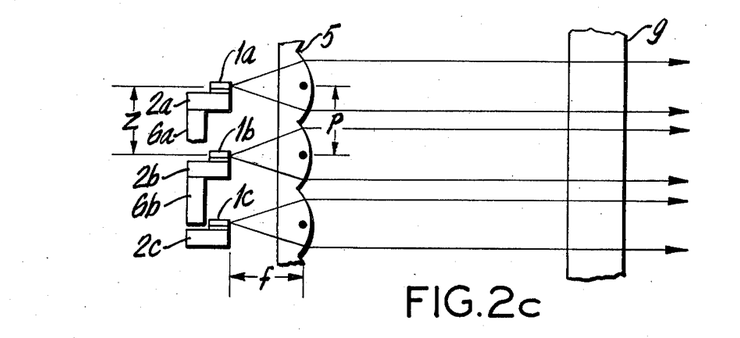

Referring now to FIGS. 1b, and 2c, spacing elements $6a$, $6b$, etc., may be advantageously positioned between the vertically stacked substrate elements, 2a and 2b, 2b and 2c, etc., respectively, for an additional control on the vertical position of each laser element in order to ensure accurate alignment between each row of laser elements and its corresponding inner lens. Accordingly, the thickness of each spacer 6 is selected such that the distance z between adjacent rows of laser sources, i.e. the line source from which the laser emanates, is exactly equal to the pitch p between the focal axes of adjacent inner lenses for the pre-selected operating temperature, with the line laser sources of each row being essentially parallel to the focal axis of its corresponding inner lens. Thus, all the individual laser beams are collimated in a plane normal to the focal axes of the inner lenses in the far field pattern. Advantageously, spacers 6 may be made of a good electrical/thermal insulating material, such as acrylic, which, as hereinafter described, is particularly useful where the substrates are employed as electrical and/or thermal conductors for preventing short circuit and/or thermal gradients between adjacent substrates.

Figure 3A:
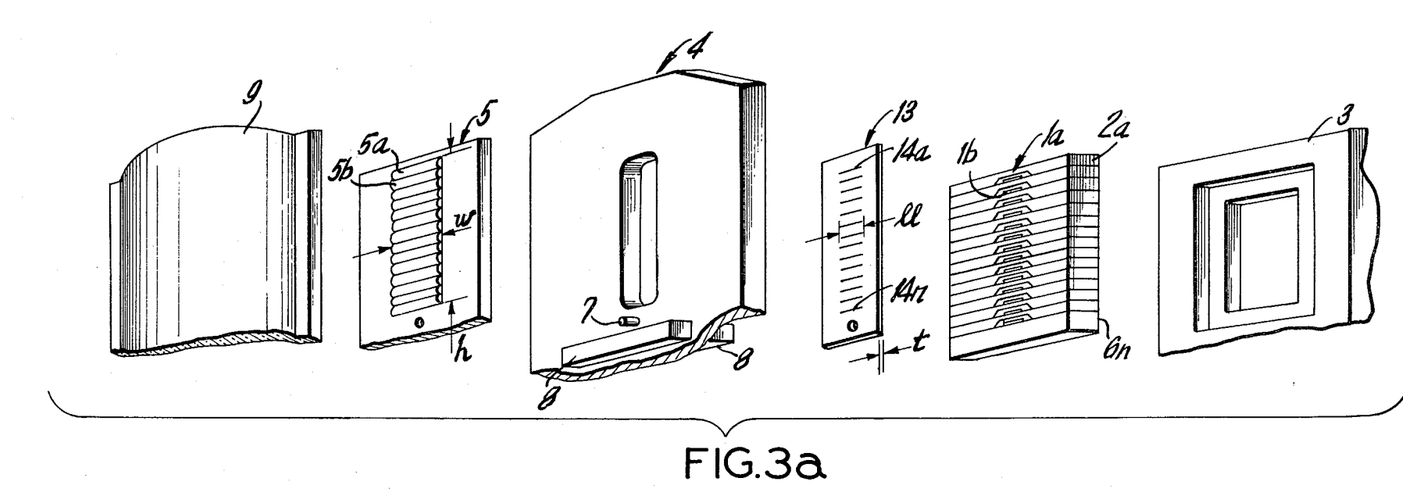
FIG. 3a is an exploded view of another embodiment of the present invention incorporating a lenticular optical integrator.
Figure 3B:
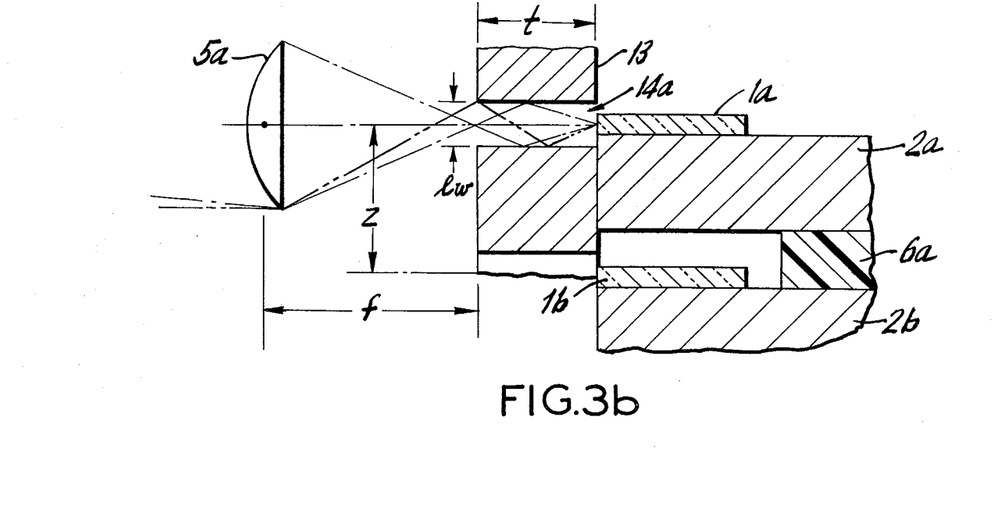

Furthermore, as best illustrated in FIGS. 2c and 3b, each substrate 2 may be an essentially flat member which is separated from its neighboring substrate in the array by the spacers 6 such that the above-described step-like indentation need not be formed in the substrate. Rather, each spacer 6 may also be utilized to provide sufficient spacing between adjacent substrates for accommodating laser diodes 1 mounted on each substrate, and seal them from events occurring behind the substrates.

According to one aspect of the present invention, where a plurality of laser generating elements is required, the laser elements are arranged in an essentially symmetrical two dimensional array with an essentially single laser emitting surface. Accordingly, the substrates 2, spacers 6, frame 4 and lenses 5a, 5b, etc. may be proportioned during assembly so as to form an aligned optical system when subjected to its preselected operating temperature. Thus, the spacers 6 and the substrates 2 may be advantageously proportioned, allowing for their thermal contraction and expansion, such that when subjected to the pre-selected operating temperature for the system, the laser emitting portion of each diode is essentially precisely aligned with the focal axis of its corresponding inner lens, allowing for the thermal contraction and expansion of the lenses.

Advantageously, frame 4 may be provided with reference means in the form of alignment pin 7 and fence 8 both of which are formed on both sides of frame 4 in order to set the proper relative alignment between the laser elements on the front side, as positioned by substrates 2a, 2b, etc., and spacers 6a, 6b, etc., and the lenslets 5a, 5b, etc., on the other side. As preferably embodied, the inner lenses may be formed as an integral lenticular array of lenslets from a single sheet of transparent lens material such as acrylic to provide accurate alignment by reference against fence 8. Also advantageously, each substrate and spacer as well as the lenticular lens array are fabricated so as to be essentially completely symmetrical in order that alignment may be conveniently provided. In addition, once the assembly members have been proportioned for alignment at the prescribed operating temperature, substrates 2 with the laser elements 1 mounted thereon, spacers 6, frame 4, and lenticular lens array 5, may advantageously be securely fastened together as a laser module by any convenient means to provide essentially permanent alignment of the laser module elements. Advantageously, such fastening may be accomplished with a minimum number of parts by securing compression clamp 3 to frame 4, such as by a set screw, with the laser substrates 2 therebetween. In a particularly useful embodiment, a second compression clamp 3 (not shown) may be positioned in front of lens array 5 to secure lenticular lens array 5 against the other side of frame 4 such that the laser module is essentially permanently clamped in place between clamps 3. Thus, for example, where the laser array system is intended for operation at cryogenic temperatures, the laser module elements may be misaligned during assembly at, for example, room temperature, such that after the system has been exposed to its cryogenic operating temperature, the substrates and fence 8 on one side of frame 4 are allowed such thermal contraction as to align each line laser source essentially precisely with its corresponding lenslet of lenticular lens array 5 after it and fence 8 on the other side of frame 4 have undergone their thermal contraction.

Advantageously, clamps 3 and frame 4 are made from structurally strong materials having essentially the same coefficients of thermal expansion to minimize the thermal gradient through the parts comprising the laser module. As preferably embodied, clamps 3 and frame 4 are made from the same material, such as stainless steel. In addition, substrates 2 are also made of a material which has essentially the same coefficient of thermal expansion as frame 4 and clamps 3, such as, for example, high purity copper. Moreover, it will be understood that the laser module may include upper and lower sections of essentially identical members whereby additional laser elements may be provided in the laser module. Accordingly, a second alignment pin 7 (not shown) may be similarly formed on both sides of frame 4 below each fence 8 for referencing a second set of substrates and spacers against the bottom of fence 8 on one side of frame 4 and another lenticular lens array against the bottom of fence 8 on the other side of frame 4. For convenience only the upper portion of frame 4, and the other elements comprising the upper laser module, have been illustrated, with the lower portion cut away. However, it will be understood that both upper and lower laser modules are essentially identical.

Referring now to FIGS. 2a, 2b and 2c, the above-described optical system is illustrated for use in a laser array of high laser diode packing density. Accordingly, the laser array is formed in a symmetrical two dimensional array comprising a plurality of horizontally extending rows of laser diodes, e.g. laser elements $1a'$, $1a''$ ... $1a^n$; $1b'$, $1b''$ ... $1b^n$, etc. The laser elements of each row emit laser radiation along a straight or nearly straight line or band such that each row requires only a single lenslet, extending essentially the entire length of its corresponding row, to focus or collimate the laser radiation in the plane perpendicular to its focal axis. In addition, as shown in FIG. 2c, each row of laser elements, 1a, 1b, etc., is spaced from the focal axis of its corresponding lenslet 5a, 5b, etc., respectively, by a distance equal to the focal length f thereof. Moreover, each lenslet 5a, 5b, etc. is of sufficiently wide lens aperture to capture substantially all the laser radiation emitted by its corresponding row of laser elements diverging in a plane perpendicular to their focal axes. Furthermore, as shown in FIG. 2b, outer lens 9 is of sufficiently wide lens aperture W to capture substantially all of the laser radiation diverging in a plane perpendicular to its focal axis. In addition, a laser generating unit of minimum field angle deviation in the horizontal plane may be provided by mounting the laser elements on each substrate 2 so that they are aligned along vertical lines parallel to the focal axis of outer lens 9 and located on the plane coincident with the back focal length f of the lens. Advantageously, the laser elements of each row may be spaced apart a distance v in the horizontal plane such that v<<F, in order that all beams fill the outer lens, as shown in FIG. 2b. Furthermore, where a weighted energy pattern in the horizontal plane is desirable, the lasers may be displaced symmetrically from such vertical line, parallel to the axes of the lenslets of the lens array.

According to another aspect of the present invention, the curved or cylindrical surface of both outer lens 9 and the lenslets 5a, 5b, etc., may be formed in a slightly acylindrical shape, i.e. not formed to a precisely cylindrical shape as prescribed by lens equation for one dimension, in order to collimate the laser beams with minimal one dimensional optical aberrations (analogous to spherical aberrations in spherical optics) in the transmission of laser radiation in a plane perpendicular to the focal axis of outer lens 9 or of lenslets 5a, 5b, etc. According to this aspect of the present invention, it is possible to obtain a high quality far field pattern of laser radiation which is essentially collimated in the two orthogonal planes perpendicular to the crossed focal axes of the outer lens 9 and the lenslets 5a, 5b, etc., with a beam width deviation of no more than about one-half of a degree ($\frac{1}{2}°$). Advantageously, these curved surfaces may be formed in a generally elliptical shape, as hereinafter described, to provide essentially collimated laser radiation in the planes perpendicular to the respective focal axes of the outer lens 9 and the lenslets 5a, 5b, etc., in a lens design which is capable of fabrication from a practical standpoint.

According to this aspect of the present invention, the acylindrical shape of the curved surfaces of both outer lens 9 and each individual lenslet 5a, 5b, etc. may be formed to a generally elliptical shape defined by the following equations which represent the conic section term of the theoretical corrected lens equation (generally in the form of an infinite series polynomial) to enable fabrication of a lens by currently known lens fabrication techniques while providing a lens with generally aberration-free optical properties of the laser radiation generated by the system. However, although better optical performance may be possible by designing a lens to a generally deformed elliptical surface by including the fourth order or higher terms of the theoretical equation, current lens fabrication techniques are incapable of grinding a lens to such shape. Furthermore, the lenses according to the embodiments set forth below have achieved improvements over cylindrical lens system heretofore available by as much as 7.5 to 1, as compared with the ideal correction which would be expected to improve optics by about 8 to 1.

Referring now to FIGS. 2b and 2c, there are illustrated coordinate reference axes for use in defining the acylindrical curved surface according to the present invention for outer lens 9, wherein X is the distance along a tangent drawn to the curved lens surface at the bisector of the lens through its vertex, measured positively or negatively from the intersection of the bisector and the tangent; and Y is the distance in the direction perpendicular to the tangent, between the tangent and the curved lens surface. Accordingly, the following equation may be used to define the generally elliptical curved surface of outer lens 9 and of inner lenslets 5a, 5b, etc.:

$$Y = \frac{CX^2}{1 + \sqrt{1 - (K+1)(C^2X^2)}},$$

where C is the vertex curvature and K is the conic constant. In general, the value of C depends upon the focal length of the lens and the index of refraction of the material from which the lens is made. In addition, the value of K depends primarily upon the index of refraction of the lens material but is also affected by the lens aperture.

More specifically, the value for C may be computed from the focal length, f, and the index of refraction, n, of the lens material according to the following formula:

$$1/f = (n-1)C.$$

Regarding the computation of K, in the ideal state wherein the light source is "immersed" in the lens, the value of K may simply be the reciprocal of the index of refraction, or 1/n. However, as in the arrangement according to the present invention, where the lens has a plane surface behind which the light source is placed, the value of K may be advantageously modified slightly from the 1/n value in view of the lens aperture, by decreasing the value of K as given in 1/n. For lenses of relatively large lens aperture, the modification is relatively small, while the modification becomes greater for lenses of relatively smaller lens aperture. Accordingly, a conic constant may be selected which, in conjunction with the vertex curvature, provides a lens essentially free of optical aberrations for the laser radiation generated by the system according to the present invention.

Where the laser array system according to the present invention is intended for use at substantially reduced or cryogenic temperatures, it is preferred that any change in the index of refraction of the lens material due to the reduction in temperature be incorporated in the computation of the conic constant and vertex curvature. Thus, although the change in the index of refraction due to the reduction in temperature may be essentially negligible, it may be accommodated in the selection of the lens shape to minimize optical aberrations.

According to one illustrative embodiment hereinafter described, wherein the focal length F of outer lens 9 is about 16.5 inches the following values of these constants have been found particularly useful for an acrylic lens which may be assumed to operate at room temperature: C may equal 0.12583 and K may equal −0.5795. In addition, according to the illustrative embodiments hereinafter described, the following values have been found particularly useful for the inner lenses made of acrylic and operating at cryogenic temperatures: C equals 7.407407 and K equals −0.545 (f=0.25").

Thus, it will be appreciated that lens 9 and each lenslet 5a, 5b, etc. are essentially symmetrical about their bisectors. In addition, from a practical standpoint, lenticular lens array 5 and outer lens 9 may be advantageously fabricated from a plastic material such as acrylic which, unlike glass, may be ground to such acylindrical or elliptical shapes.

Referring now to FIG. 3a, there is shown another aspect of the present invention wherein a relatively wider field angle of laser radiation in the vertical plane may be generated without resorting to impractically short focal length lenslets in the lenticular array 5. Accordingly, lenticular optical integrator 13 of thickness t is positioned between frame 4 and the laser diodes 1a, 1b, etc., or rows thereof, in a system otherwise identical to that shown in FIG. 1a. The integrator is formed with slots 14a, 14b, etc., positioned in horizontal registration with, respectively, laser elements 1a, 1b, etc., or rows thereof, to receive laser radiation emitted therefrom and integrate the radiation by multiple internal reflection, as illustrated in FIG. 3b. Integrator 13 thereby generates an apparent optical source having an elongated generally rectangular cross section, which is generally uniform in radiant intensity, at the edge of each slot nearest lenticular lens array 5, such that the elements comprising the remainder of the spacing and optical system may be proportioned and positioned with reference to such effective laser source.

The vertical field angle of each of the individual laser beams is therefore determined by the vertical dimension or line width, lw, of each slot and the focal length of its corresponding lenticular lens element. Advantageously, adjacent slots in the optical tunnel are accurately spaced apart the identical distance z, as discussed above, which is the same as the spacing or pitch, p, between the associated lenslets in the lenticular lens array, as illustrated in FIG. 3b. Also advantageously, the slots 14a, 14b, etc. of integrator 13 have a sufficiently wide line width, lw, in the vertical direction to capture substantially all of the light emitted by its corresponding laser element or row thereof and are sufficiently long, i.e. due to the thickness t of integrator 13, to generate a uniform energy density field at the exit of the integrator.

In operation, the horizontal field pattern emanating from the laser array is generally unaffected by the presence of the optical integrator 13 where the horizontal width, or line length, ll, of each slot is at least as long as, or slightly larger than the length of its corresponding laser elements. Advantageously, the length, ll, of each slot 14, is about 10% longer than the length of its corresponding row of laser elements. However, the horizontal field pattern may be reduced by dimensioning the width of each optical slot or tunnel 14a, 14b, etc., less than the length its corresponding row of laser elements. Accordingly, the horizontal field pattern may be determined by the horizontal line length, ll, of the slots and the focal length of the outer lens. Advantageously, optical integrator 13 is made of a material, such as electroless nickel, which has essentially the same coefficient of thermal expansion as the material comprising substrates 2 and frame 4, for effecting alignment of slots 14 with its corresponding laser diode at the operating temperature of the system.

In a particularly useful embodiment of the present invention, the following dimensions have been found advantageous when used with lenses formed according to the above-recited acylindrical shape. The pitch p, between adjacent lenslet is 0.09 inches as well as the spacing, z, between diodes; the height or line width, lw, of the slots in optical integrator 13 is 0.002 inches; the thickness, t, of optical integrator 13 may be about 0.01 inches; the thickness, t, of frame 4 may be about 3/16 of an inch; the thickness of each substrate 2 is about 0.08 inches; the thickness of spacers 6 is about 0.01 inches; the height, h, of the lenticular lens array 5 may be about 1.26 inches and the width, w, thereof may be about 0.5 inches; and, the thickness of lens array up to its focal axes may be about 1/16 of an inch. In addition, the focal length, f, of the lenslets 5a, 5b, etc., (with respect to the emitting faces of the laser diodes or with respect to the outer surface of the optical integrator 13, if such is employed) is 0.25 inches and the lens aperture of each lenslet is 0.09 inches; the focal length, f, of the outer lens (measured as discussed with respect to the focal length, f, of lenslets 5a, 5b, etc.) is 16.5 inches and the width, or lens aperture, w of outer lens 9 may be about 5 inches.

Figure 1C:
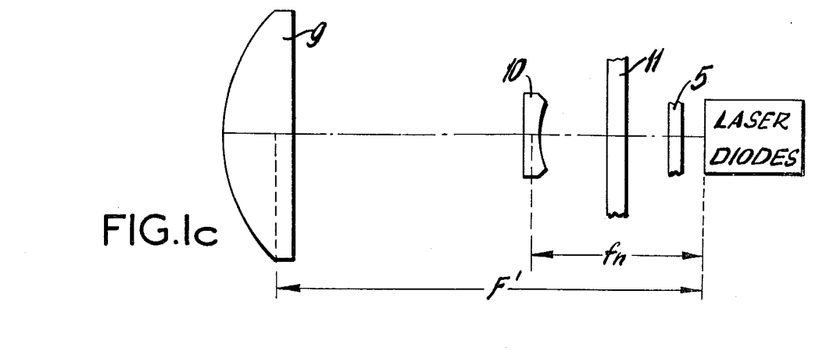
FIG. 1c is a perspective view of one embodiment of the lens system according to the present invention, utilizing a telephoto collimator.

Referring now to FIG. 1c, there is illustrated a preferred embodiment of the present invention, which is particularly useful for applications wherein compactness of the system packaging may be an essential consideration. Advantageously, the system may include essentially the same elements as discussed above generally with respect to FIGS. 1a, 1b and 3a with the exception that outer lens 9 may form part of a compact telephoto collimator which includes negative lens 10 and which requires approximately one-half the packaging distance of the single outer lens embodiment. According to this aspect of the present invention, negative lens 10 is spaced from the source—effective or real—of laser radiation a distance equal to its focal length, $f_n$, which may range from about $\frac{1}{3}$ to about 3/5 of focal length, F', of outer lens 9, which focal length may be about $\frac{1}{2}$ of F, the focal length of outer lens 9 in the embodiment without negative lens 10.

Referring again to FIG. 1c, there is illustrated a preferred embodiment of the present invention, which is particularly useful for operating in the cryogenic temperature range, as hereinafter described. Advantageously, the system may include window 11 positioned in front of lens array 5 for substantially preventing the evaporated gases of liquid coolant, as hereinafter described, from entering the space between lens array 5 and outer lens 9 in order to prevent the circulating gases from removing heat from the outer lenses, 9 and 10, and transferring it to the frame 4 by convection, which would cause thermal expansion thereof and mis-alignment of the optical members. Although window 11 is illustrated in conjunction with the telephoto collimator, it will be understood that it is equally useful in an embodiment of the present invention without negative lens 10.

Accordingly, in the embodiment specified above, the following modifications to the outer lens 9 have been found particularly advantageous when outer lens 9 forms part of a telephoto collimator: the focal length F' of outer lens 9 is 7.692 inches and the constant C equals 0.269905 while the constant K equals −0.5595. In addition, the focal length $f_n$ of negative lens 10 equals −2.183 inches and has a circular cross-sectional radius of 1.0516 inches. Although the presence of window 11 in the system has a virtually negligible optical effect upon the resultant laser radiation, when it is included in the system, it is preferred to move the laser module "in" towards outer lens 9 by about $\frac{1}{3}$ the thickness of the window to obtain the sharpest possible laser beam, i.e. by a ratio of i − 1/i, where i is the index of refraction for the window material, which for glass or acrylic is about 1.5.

In high power illuminator applications, to which the present invention may be directed, considerable amounts of undesirable heat are generated by the laser diodes. Therefore, in order to obtain highly efficient output and allow high peak and/or average power output, this heat must be extracted from the laser diode-substrate combination.

Figure 4A:
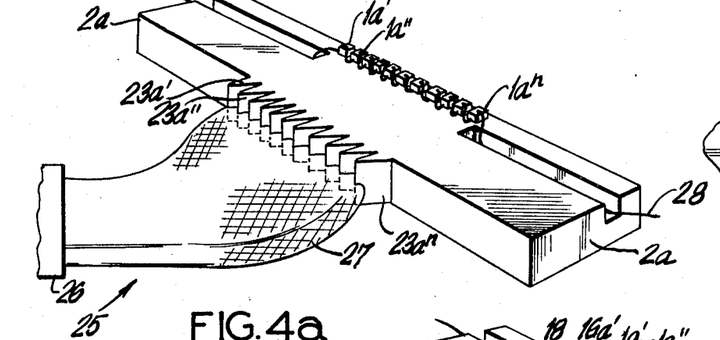
FIGS. 4a and 4b are rear views of two embodiments of coolant applicator means according to the present invention.

Referring now to FIG. 4a, there is illustrated one embodiment of the heat extraction means according to another aspect of the present invention. According to the aspect shown in FIG. 4a, the surface area of the rear surface of each substrate 2a, 2b, etc., is effectively expanded to allow for the extraction of the large quantities of heat generated by a laser array having a high density packing of laser elements. Advantageously, this may be accomplished by providing groups of fin-like extensions 23a, 23b, etc., corresponding, respectively, to the rows of laser diodes 1a, 1b, etc. For convenience, only one group of extensions, 23a, is shown, although it will be understood that each substrate may be provided with identical groups of extensions. Advantageously, each substrate 2a, 2b, etc., and its corresponding fin-like extensions 23a, 23b, etc., are formed from high thermally conductive material and are constructed so as to provide a short thermal path between the laser diodes and the rear face of the substrate as defined by the extension peaks. Thus, each row of laser diodes comprises laser diodes $1a', 1a'' \ldots 1a^{n-1}, 1a^n$, which are connected in electrical series and mounted to substrate 2a which in turn is formed with extensions $23a', 23a'' \ldots 23a^n$. Furthermore, in order to withdraw the heat generated by the laser elements, the heat extraction means includes coolant applicator means 25 which provides liquid coolant (not shown) to the rear surface of each substrate and maintains a thin layer of the coolant thereon.

Figure 4B:
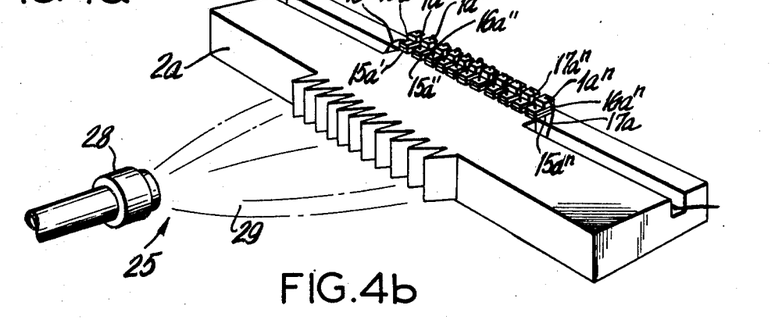
Figure 4C:
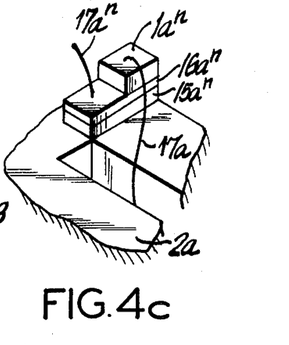
FIG. 4c is an enlarged view of a laser diode mounting means according to the embodiment shown in FIG. 4b.

Advantageously, as illustrated in FIG. 4b, coolant applicator means 25 may comprise sprayer 28 in communication with a reservoir of liquid coolant and any convenient pumping means (not shown) for transferring the coolant to sprayer 28. Sprayer 28 has been found particularly advantageous since the rate of flow of the coolant (indicated at 29) applied to the rear surface of the substrates may be directly controlled for high cooling efficiency and to maintain the substrates, and therefore the laser elements, at the desired temperature.

Advantageously, the liquid coolant may be of a relative low thermal capacity in order that the heat extraction means does not rely upon convection or conduction by the liquid. Also advantageously, and as here preferably embodied, the liquid coolant may have a boiling point essentially equal to the difference between the pre-selected operating temperature of the laser diodes less the temperature gradient due to the thermal impedance of the substrates, 2a, 2b, etc., across the length thereof. Accordingly, upon contacting the rear surface of the substrates, the temperature of the liquid coolant is raised to its boiling point. If the temperature of the substrate is greater than the coolant boiling temperature, the additional heat is absorbed by the coolant in the form of its heat of vaporization, causing it to boil and evaporate. As the coolant undergoes the change-of-state, its vapors expand and leave the immediate area of the substrate to enable more liquid coolant to contact the substrate, whereby the temperature of the substrate remains essentially at the coolant's boiling point, ensuring that the laser diodes function substantially at their desired operating temperature and that there is no build-up of a gaseous insulating layer between the substrate and the coolant source. For operation in the cryogenic range of temperature, liquid nitrogen and liquid argon have been formed particularly useful while coolants such as ammonia or "Freon-21" have been found useful at room temperature.

Referring now to FIG. 4b, there is shown an alternate embodiment of the coolant applicator means 25 which may comprise a wick system wherein one end of the wick 27 is positioned in direct contact with extensions 23 and the other end of wick 27 is coupled to a reservoir of liquid coolant (not shown), such as by conduit 26. The wick 27 continuously applies a thin coat of the liquid coolant to the surfaces of fin-like extensions 23 due to the capillary action of the liquid coolant between the wick and the substrate, in order to maintain the substrate, and therefore the diodes, within the desired range of operating temperatures. Advantageously, the liquid coolant is selected as discussed above.

Referring again to FIG. 4b, there is shown a preferred embodiment of a substrate included in the heat extraction means according to the present invention wherein the material comprising substrate 2 may be a metal or other highly thermally conductive material which is also electrically conductive. Accordingly, each laser element $1a', 1a'' \ldots 1a^n$ is mounted respectively, to an electrically insulating/thermally conductive element $15a', 15a'' \ldots 15a^n$ to separate it from substrate 2a and prevent a short circuit therethrough. Advantageously, each insulating element $15a', 15a'' \ldots 15a^n$ is provided with, respectively, conductive layers $16a', 16a'' \ldots 16a^n$ in contact with the bottoms of, respectively laser elements $1a', 1a'' \ldots 1a^n$ to provide a convenient means for electrically coupling the laser elements in series. Thus, the laser elements, may be electrically connected by coupling the conductive layer of one element to the top of the next adjacent laser elements, such as by a conductor elements 17. Moreover the top of the first laser element, $1a'$, may be connected to a suitable power source by lead 18 and the conductive layer $16a^n$ corresponding to the last laser diode may also be connected to such power source, or to the next horizontal row of laser elements, 1b, by conductor 19. Advantageously, substrate 2 may be made of high purity copper, insulating elements 15 may be made of beryllium oxide and conductive layers 16 may be made of gold.

Figure 5A:
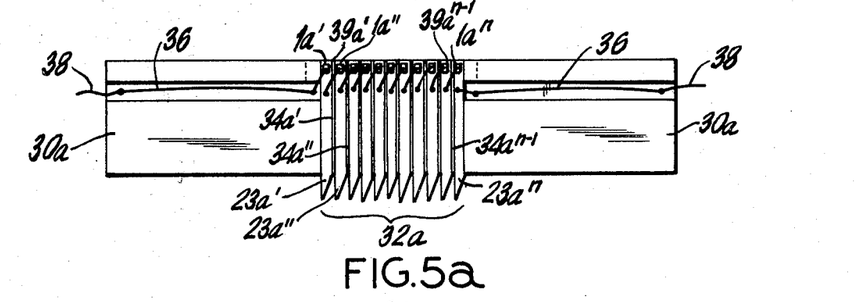
FIGS. 5a and 5b are rear and top views, respectively, of an alternate embodiment of the mounting substrate according to the present invention.
Figure 5B:
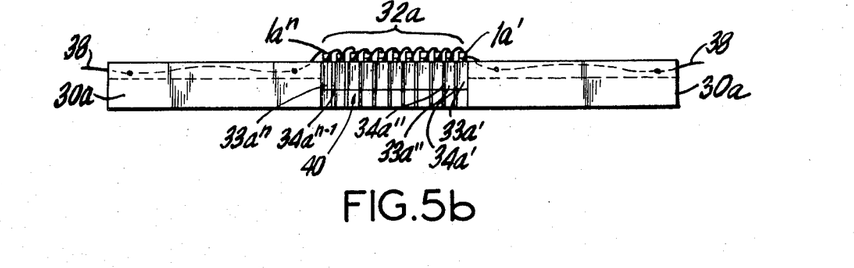

Referring now to FIGS. 5a, and 5b, there is illustrated a preferred substrate which includes a highly efficient embodiment of the heat extraction means according to the present invention. According to this embodiment, the mounting substrate is formed in two basic portions, a "passive" structure 30 and an "active" structure 32. The passive structure 30 is substantially identical to the basic substrate 2 insofar as its function in positioning the laser diodes 1a, 1b, etc., or rows thereof to register with their corresponding lenticular lenslets 5a, 5b, etc. respectively, and, if used, lenticular optical integrator 13. The active structure 32 advantageously provides both an improved means for electrically activating the laser generating diodes as well as extracting the heat generated by the diodes.

Advantageously, the active structure 32 is formed as a laminate of alternating layers of high thermal-high electrical conducting material, 33, on the one hand, and highly electrical insulating material 34, on the other. FIGS. 5a and 5b illustrate one laser diode substrate according to this aspect of the present invention, comprising passive structure 30a and active structure 32a, corresponding to one substrate 2 for supporting a row of diodes. However, it will be understood that the complete diode substrate may be formed from a plurality of identical substrates comprising such structures, as 30b and 32b, 30c and 32c, etc., corresponding respectively to laser elements 1b, 1c, etc., or rows thereof. Accordingly, vertically stacked passive substrate members 30a, 30b, etc. may be separated by spacer elements 6a, 6b, etc. for accurate spacing and alignment of the laser elements as discussed above with reference to FIG. 1b. Moreover, each active member 32 is provided with n layers of high thermal-high electrical conducting material 33a', 33a''...33a$^n$, and n−1 layers of highly electrically insulating material, 34a', 34a''...34a$^{n-1}$ between each pair of conductive substrates, where n equals the number of laser diodes in each row thereof. Accordingly, each diode 1a', 1a'',...1a$^n$ of each row, is supported, respectively, on its corresponding high thermal-high electrical layer, 33a', 33a''...33a$^n$, with substrates 33a' and 33a'', 33a'' and 33a'''...33a$^{n-1}$ and 33a$^n$ separated respectively, by electrical insulating members 34a', 34a''...34a$^{n-1}$. Advantageously, substrate elements 33a', 33a''...33a$^n$ may be made of very high purity copper, i.e. about 99.94% pure, which has been found to be a highly efficient electrical conductor, especially at cryogenic temperatures, as well as a highly efficient heat conductor. Also advantageously, two additional insulating members 34 may be included between the first conductor element 33a' and one portion of passive substrate member 30 as well as the last conductor element 33a$^n$ and the other portion of passive substrate member 30 where the passive member is also made of an electrically conductive material such as copper.

The laser diodes are coupled by conductor 36 to a power source (not shown), such as by "pigtail" leads 38, between the top of the first diode 1a' and the substrate 33a$^n$ in contact with the bottom of the last diode 1a$^n$. The diodes are connected in series between the first and last diodes, 1a' and 1a$^n$ respectively, by any convenient conductor means, 39a', 39a''...39a$^{n-1}$, coupling the conductive substrate portions 33a', 33a''...33a$^{n-1}$ respectively, to the tops of the next adjacent diodes 1a'', 1a'''...1a$^n$ respectively. Advantageously, conductors 36 and 38 are insulated in the vicinity of substrate portion 30 to prevent loss of current. In addition, insulating members 34 may also be thermally insulating in order to isolate each active substrate element 33 from the thermal influences of its neighboring elements, although it will be understood that there will be a relatively small temperature gradient across each element 33 as compared with the gradient along its length. Furthermore, as described above with respect to FIG. 1a, the active substrate portion 32 may also be formed with step-like indentation 40 to provide space for the row of laser elements mounted to the substrate below and to isolate the laser elements from the effects of any operation conducted on or near the rear surface of the substrate.

According to this aspect of the invention, a high packing density of laser diodes may be achieved. Moreover, one of the simple coolant applicator means described above with reference to FIGS. 4a and 4b may be utilized for highly efficient heat removal. Advantageously, the liquid coolant used in conjunction with the embodiment illustrated in FIGS. 5a and 5b may be selected with a boiling point essentially equal to the operating temperature of the laser diodes, since there is a negligible temperature gradient across the highly conductive substrates 33.

It will be understood by those skilled in the art that the foregoing embodiments are merely illustrative of the present invention and that various modifications may be made thereto without departing from the scope and spirit of the present invention as defined in the appended claims.

What is claimed is:

1. A semiconductor laser array system which comprises:
   a plurality of laser generating elements arranged in at least one row, each of said laser elements having essentially one laser emitting surface such that said laser emitting surfaces in each row define a substantially line source of laser radiation;
   substrate means for supporting said row of laser generating elements;
   means for electrically coupling said laser elements in each said row to enable activation of said laser elements;
   one generally plano-cylindrical inner lens of relatively short focal length for each of said rows of laser elements, each said inner lens positioned in front of and in optical alignment with said line source of its corresponding row of laser elements, with its focal axis essentially parallel to corresponding row of laser elements and its flat surface essentially parallel to said laser emitting surface, and said inner lens having a lens aperture sufficiently wide to capture substantially all laser radiation emitted by its said corresponding row of laser elements, said inner lens being spaced from said laser emitting surface a distance equal to about its focal length, the curved surface of each said inner lens being formed to a slightly acylindrical shape for collimating laser radiation diverging in first planes perpendicular to the focal axis of each said inner lens generally free of optical aberration in said first planes; and
   a single generally plano-cylindrical outer lens of longer focal length than that of said inner lenses, positioned in front of said inner lenses and in optical alignment with at least one row of said laser elements, with its focal axis essentially perpendicular to said focal axes of said inner lens and its flat surface essentially parallel to said flat surface of said inner lens, said outer lens having a sufficiently wide lens aperture to capture substantially all laser radiation transmitted by said inner lenses and the focal axis of said outer lens being spaced from said laser emitting surface a distance equal to about its focal length, the curved surface of said outer lens being formed to a slightly acylindrical shape for collimating laser radiation diverging in second planes perpendicular to the focal axis of said outer lens generally free of optical aberration in said second planes.

2. A semiconductor laser array system which comprises:
   a plurality of laser generating elements arranged in a plurality of essentially parallel rows, each of said laser elements having essentially one laser emitting surface such that said laser emitting surfaces in each row define a substantially line source of laser radiation and all said laser emitting surfaces define an essentially common plane;
   substrate means for supporting each said row of laser generating elements;
   means for electrically coupling said laser elements in each said row to enable activation of said laser elements;
   a plurality of plano-cylindrical inner lenses of relatively short focal length, one said inner lens for each of said rows of laser elements, each said inner lens positioned in front of and in optical alignment with said line source of its corresponding row of laser elements, with its focal axis essentially parallel to its corresponding row of laser elements and its flat surface essentially parallel to said laser emitting surface, each said inner lens having a lens aperture sufficiently wide to capture substantially all laser radiation emitted by its said corresponding row of laser elements, and all said inner lenses being formed as an one-piece lenticular lens array which is spaced from said laser emitting surface a distance at least equal to about the focal length of each said inner lens; and a single generally plano-cylindrical outer lens of longer focal length than that of said inner lenses, positioned in front of said inner lens and in optical alignment with at least one row of said laser elements, with its focal axis essentially perpendicular to said focal axis of said inner lens and its flat surface essentially parallel to said flat surface of said inner lens, said outer lens being sufficiently long and having a sufficiently wide lens aperture to capture substantially all laser radiation transmitted by said inner lenses and the focal axis of said outer lens being spaced from said laser emitting surface a distance equal to about its focal length.

3. A semiconductor laser array system according to claim 2, further including:

a plurality of said substrates, equal in number to said plurality of rows, each of said substrates supporting one of said rows; and means for providing sufficient space between adjacent substrates to accommodate one of said rows of laser elements and for essentially isolating said row of laser elements from events occurring generally behind said substrates, said substrates and said lenticular lens array being proportioned and positioned relative to each other such that the laser emitting surface of each of said rows is essentially precisely aligned with its corresponding inner lens at its operating temperature.

4. A semiconductor laser array system according to claim 3 wherein said space-providing means comprises a step-like indentation formed in the front face of each of said substrates, with and the rear faces of all the substrates being adapted to abut in a generally sealingly tight fashion.

5. A semiconductor laser array according to claim 3, wherein said space-providing means comprises spacer elements positioned between adjacent substrates, said spacer elements being proportioned to optically align the laser emitting surface of each row essentially precisely with its corresponding inner lens at the predetermined operating temperature, with the rear faces of said spacer elements and said substrates abutting in a generally sealingly tight fashion.

6. A semiconductor laser array system according to claim 3, which further includes:

a frame adapted to separate said laser emitting surfaces from said lenticular lens array such that the focal axis of said inner lenses are separated from said common plane distance essentially equal to said focal length of said inner lenses at the predetermined operating temperature;
and, means for clamping said substrates, said frame, said space-providing means and said lenticular lens array in a laser module such that each of said rows of laser elements is essentially permanently precisely optically aligned with its said corresponding inner lens of said lenticular lens array at said predetermined operating temperature.

7. A semiconductor laser array system which comprises:

a plurality of laser generating elements arranged in essentially parallel rows, each of said laser elements having essentially one laser emitting surface such that said laser emitting surfaces in each row define a substantially line source of laser radiation and the lines of laser radiation define an essentially common plane;

a plurality of substrates, equal in number to the number of rows of said laser elements, each of said substrates supporting one of said rows;

means for electrically coupling said laser elements in each said row to enable activation of said laser elements;

an optical integrator positioned essentially adjacent said laser emitting surface, said integrator having a plurality of slots corresponding in number and relative location to said rows of laser elements and proportioned to receive essentially all laser radiation emitted by its corresponding row of laser elements for integrating said laser radiation by multiple internal reflection and generating an effective laser source of generally uniform density from the edge of each slot opposite that adjacent said laser generating members, said integrator being adapted for alignment of said slots with their corresponding rows of laser elements at the predetermined operating temperature;

one generally plano-cylindrical inner lens of relatively short focal length for each of said rows of laser elements, each said inner lenses positioned in front of and for optical alignment with a corresponding slot in said integrator at the predetermined operating temperature, with the focal axis of each inner lens essentially parallel to its corresponding row of laser elements and its flat surface essentially parallel to said common plane, each said inner lens having a lens aperture sufficiently wide to capture substantially all laser radiation emitted by its said corresponding slot and being spaced from the apparent optical source of said laser elements a distance equal to about its focal length, all of said inner lenses being formed as an essentially one-piece integral lenticular lens array;

a single generally plano-cylindrical outer lens of longer focal length than that of said inner lenses, positioned in front of said inner lenses and in optical alignment will all of said slots, with its focal axis essentially perpendicular to said focal axes of said inner lenses and its flat surface essentially parallel to said common plane, said outer lens having a sufficiently wide lens aperture and being sufficiently long to capture substantially all laser radiation transmitted by said inner lenses and the focal axis of said outer lens being spaced from the apparent optical source of said laser elements a distance equal to about its focal length;

means for providing sufficient space between adjacent substrates to accommodate one of said rows of laser elements and for essentially isolating said row of laser elements from events occurring generally behind said substrates, said substrates and said lenticular lens array being proportioned and positioned relative to each other such that the effective source of said laser elements of each of said rows is essentially precisely optically aligned with its corresponding inner lens at the predetermined operating temperature;

a frame for separating said effective laser source from said lenticular lens array such that the focal axes of said inner lenses are separated from said effective source a distance essentially equal to said focal length of said inner lenses at the predetermined operating temperature; and means for clamping said substrates, said frame, said space-providing means, said integrator and said lenticular lens array in a laser module such that each slot of said integrator is essentially permanently precisely aligned with its said corresponding inner lens of said lenticular lens array at the predetermined operating temperature.

8. A laser array system according to claim 1 wherein said laser elements are positioned essentially along the front edge of their corresponding substrate and the rear face of each of said substrates is formed with an expanded surface for dissipating heat, and which further includes coolant applicator means for applying a coolant to said expanded rear surface for maintaining said substrates substantially at said preselected operating temperature.

9. A laser array system according to claim 8 wherein said coolant comprises a liquid coolant having a generally low heat capacity and a boiling point generally at said pre-selected operating temperatures such that when said liquid coolant is applied to said expanded rear surface of said substrate, said laser elements mounted thereon are maintained substantially at said pre-selected operating temperature.

10. A laser array system according to claim 9 wherein said coolant applicator means comprises sprayer means coupled to a source of said liquid coolant and spaced from the expanded rear surface of said substrates such that said liquid coolant is applied substantially evenly to said expanded rear surface for maintaining all of said laser elements substantially at said pre-selected operating temperature.

11. A laser array system according to claim 9 wherein said coolant applicator means comprises wick means coupled to a source of said liquid coolant and contacting said expanded rear surfaces of said substrates such that said liquid coolant is applied substantially evenly to said expanded rear surface for maintaining all of said laser elements substantially at said pre-selected operating temperature.

12. A laser array system according to claim 8 wherein each of said substrates comprises:

a passive portion adapted to provide said essentially precise alignment of said laser elements with said corresponding inner lenses; and an active portion adapted to provide said mechanical support for said laser elements and to provide both heat extraction and electrical coupling means, comprising:

alternating highly electrical-highly thermal conductive diode supporting elements and highly electrical-highly thermal insulating elements, the number of said conductive elements being equal to that of said laser elements in said row thereof mounted to its said corresponding substrate, one of said laser elements having one of its top and bottom surfaces mounted directly to one of said conductive elements, and the rear face of all of said conductive elements is provided with an expanded rear surface; and electrical conductor means for coupling each of said conductive elements to the unmounted surface of its next adjacent laser element.

13. A laser array system according to claim 12 wherein said coolant is a liquid coolant having a generally low heat capacity and a boiling point generally at said pre-selected operating temperature such that when said liquid coolant is applied to said expanded rear surface of said substrate, said laser elements mounted thereon are maintained substantially at said pre-selected operating temperature.

14. A laser array system according to claim 13 wherein said coolant applicator means comprises sprayer means coupled to a source of said liquid coolant and spaced from the expanded rear surface of said substrates such that said liquid coolant is applied substantially evenly to said expanded rear surface for maintaining all of said laser elements substantially at said pre-selected operating temperature.

15. A laser array system according to claim 13 wherein said coolant applicator means comprises wick means coupled to a source of said liquid coolant and contacting the expanded rear surfaces of said substrates such that said liquid coolant is applied substantially evenly to said expanded rear surface for maintaining all of said laser elements substantially at said pre-selected operating temperature.

16. A laser array system according to claim 8 further including a plano-cylindrical negative lens of relatively short focal length having its focal axis essentially parallel to said focal axis of said outer lens and positioned between said inner lenses and said outer lens such that said negative and outer lenses form a telephoto collimator.

17. A laser array system according to claim 16 further including an essentially transparent window positioned between said inner lens and said negative lens for substantially preventing coolant gases from contacting said telephoto collimator.

18. A semiconductor laser array according to claim 8 which further includes an optical integrator positioned essentially adjacent said laser emitting surface in said laser module, said integrator having a plurality of slots corresponding in number to and alignment with said rows of laser elements and proportioned to receive essentially all laser radiation emitted by its corresponding row of laser elements for integrating said laser radiation by multiple internal reflection to generate an effective laser source of generally uniform density from the edge of each slot opposite that adjacent said laser generating members, said integrator being adapted for alignment of said slots with their corresponding rows of laser elements at said predetermined temperature, and, wherein said focal axes of said inner and outer lenses are spaced with respect to said apparent optical source.

19. A laser array system according to claim 18 further including a plano-cylindrical negative lens of relatively short focal length having its focal axis essentially parallel to said focal axis of said outer lens and positioned between said inner lenses and said outer lens such that said negative and outer lenses form a telephoto collimator.

20. A laser array system according to claim 19 further including an essentially transparent window positioned between said inner lens and said negative lens for substantially preventing coolant gases from contacting said telephoto collimator.

21. A laser array system according to claim 6 wherein said laser elements are positioned essentially along the front edge of their corresponding substrate and the rear face of each of said substrates is formed with an expanded surface for dissipating heat, and which further includes coolant applicator means for applying a coolant to said expanded rear surface for maintaining said substrates substantially at said pre-selected operating temperature.

22. A laser array system according to claim 21 wherein said coolant comprises a liquid coolant having a generally low heat capacity and a boiling point generally at said pre-selected operating temperature such that when said liquid coolant is applied to said expanded rear surface of said substrate, said laser elements mounted thereon are maintained substantially at said pre-selected operating temperature.

23. A laser array system according to claim 22 wherein said coolant applicator means comprises sprayer means coupled to a source of said liquid coolant and spaced from the expanded rear surface of said substrates such that said liquid coolant is applied substantially evenly to said expanded rear surface for maintaining all of said laser elements substantially at said pre-selected operating temperature.

24. A laser array system according to claim 22 wherein said coolant applicator means comprises wick means coupled to a source of said liquid coolant and contacting said expanded rear surfaces of said substrates such that said liquid coolant is applied substantially evenly to said expanded rear surface for maintaining all of said laser elements substantially at said pre-selected operating temperature.

25. A laser array system according to claim 21 wherein each of said substrate comprises:
a passive portion adapted to provide said essentially precise alignment of said laser elements with said corresponding inner lenses; and
an active portion adapted to provide said mechanical support for said laser elements and to provide both heat extraction and electrical coupling means, comprising:
alternating highly electrical-highly thermal conductive diode supporting elements and highly electrical-highly thermal insulating elements, the number of said conductive elements being equal to that of said laser elements in said row thereof mounted to its said corresponding substrate, one of said laser elements having one of its top and bottom surfaces mounted directly to one of said conductive elements, and the rear face of all of said conductive elements is provided with an expanded rear surface; and
electrical conductor means for coupling each of said conductive elements to the unmounted surface of its next adjacent laser element.

26. A laser array system according to claim 25 wherein said coolant is a liquid coolant having a generally low heat capacity and a boiling point generally at said pre-selected operating temperature such that when said liquid coolant is applied to said expanded rear surface of said substrate, said laser elements mounted thereon are maintained substantially at said pre-selected operating temperature.

27. A laser array system according to claim 26 wherein said coolant applicator means comprises wick means coupled to a source of said liquid coolant and contacting said expanded rear surfaces of said substrates such that said liquid coolant is applied substantially evenly to said expanded rear surface for maintaining all of said laser elements substantially at said pre-selected operating temperature.

28. A laser array system according to claim 1 wherein said acylindrical curved surface of said inner lens is generally elliptical and said acylindrical curved surface of said outer lens is generally elliptical.

29. A laser array system according to claim 1 further including a plurality of said rows of laser elements and of said inner lenses, said rows being arranged in essentially parallel rows, and wherein all of said laser emitting surfaces define an essentially common plane and said inner lenses comprise an essentially one-piece integral lenticular array having essentially one flat surface.

30. A laser array system according to claim 29 wherein said acylindrical curved surfaces of said inner lenses are generally elliptical and said acylindrical curved surface of said outer lens is generally elliptical.

31. A laser array system according to claim 29 further including a frame positioned between said flat laser emitting surface and said flat surface of said lenticular inner lens array for spacing said focal axes of said inner lenses from said flat laser emitting surface a distance equal to about said focal length of said inner lenses.

32. A laser array system according to claim 31 wherein said frame includes means providing a reference for said substrates and said lenticular lens array such that each of said rows of laser elements is aligned with its corresponding inner lens of said lenticular lens array and further including clamp means for securing said substrates with said rows of laser elements, said frame with said reference means and said lenticular lens array together in a laser module such that each of said rows of laser modules is proportioned for essentially precise optical alignment with its said corresponding inner lens at said pre-selected operating temperature and secured for substantially permanent alignment.

33. A semiconductor laser array system according to claim 27 wherein said means for providing space between substrates and for isolating rows of laser elements comprises:
spacer elements positioned between adjacent substrates, said spacer elements providing a generally sealingly tight closure at the rear faces of said substrates, and said spacer elements proportioned to provide, with said passive portion, essentially precise alignment of said laser elements with said corresponding inner lenses at the predetermined operating temperature.

34. A laser array according to claim 6, wherein said space-providing means comprise spacer elements positioned between adjacent substrates, said spacer elements being proportioned to optically align the laser emitting surface of each row essentially precisely with its corresponding inner lens at the predetermined operating temperature, the rear faces of said spacer elements and said substrates abutting in a generally sealingly tight fashion.

35. A laser array system according to claim 12 wherein said means for providing space between substrates and for isolating rows of laser elements comprise:
spacer elements positioned between adjacent substrates, said spacer elements providing a generally sealingly tight closure at the rear faces of said substrates, and said spacer elements proportioned to provide, with said passive portion, essentially precise alignment of said laser elements with said corresponding inner lenses at the predetermined operating temperature.

36. A laser array system according to claim 25 wherein said means for providing space between substrates and for isolating rows of laser elements include:
spacer elements positioned between adjacent substrates, said spacer elements providing a generally sealingly tight closure at the rear faces of said substrates, and said spacer elements proportioned to provide, with said passive portion, essentially precise alignment of said laser elements with said corresponding inner lenses at the predetermined operating temperature.

37. A semiconductor laser array system which comprises:
a plurality of laser generating elements arranged in essentially parallel rows, each of said laser elements having essentially one laser emitting surface such that said laser emitting surfaces in each row define a substantially line source of laser radiation and the lines of laser radiation define an essentially common plane;
a plurality of substrates, equal in number to the number of rows of said laser elements, each of said substrates supporting one of said rows;
means for electrically coupling said laser elements in each said row to enable activation of said laser elements;
one generally plano-cylindrical inner lens of relatively short focal length for each of said rows of laser elements, each said inner lens positioned in front of and in optical alignment with said line source of its corresponding row of laser elements, with the focal axis of each inner lens essentially parallel to its corresponding row of laser elements and its flat surface essentially parallel to said common plane, each said inner lens having a lens aperture sufficiently wide to capture substantially all laser radiation emitted by its said corresponding row of laser elements and being spaced from said laser emitting surface a distance equal to about its focal length, all of said inner lenses being formed as an essentially one-piece integral lenticular lens array and the curved surfaces of each of said inner lenses being formed to a slightly acylindrical shape for collimating laser radiation diverging in first planes perpendicular to the focal axes of said inner lenses generally free of optical aberration in said first planes;
a single generally plano-cylindrical outer lens of longer focal length than that of said inner lenses, positioned in front of said inner lenses and in optical alignment with all of said rows of said laser elements, with its focal axis essentially perpendicular to the focal axes of said inner lenses and its flat surface essentially parallel to said common plane, said outer lens having a sufficiently wide lens aperture and being sufficiently long to capture substantially all laser radiation transmitted by said inner lenses, the focal axis of said outer lens being spaced from said laser emitting surface a distance equal to about its focal length and the curved surface of said outer lens being formed to a slightly acylindrical shape for collimating laser radiation diverging in second planes perpendicular to the focal axis of said outer lens generally free of optical aberration in said second planes;
means for providing sufficient space between adjacent substrates to accommodate one of said rows of laser elements and for essentially isolating said row of laser elements from events occurring generally behind said substrates, said substrates and said lenticular lens array being proportioned and positioned relative to each other such that the laser emitting surface of each of said rows is essentially precisely optically aligned with its corresponding inner lens at its predetermined operating temperature;
a frame adapted to separate said laser emitting surfaces from said lenticular lens array such that the focal axes of said inner lenses are separated from said common plane a distance essentially equal to said focal length of said inner lenses at the predetermined operating temperature; and
means for clamping said substrates, said frame, said space-providing means and said lenticular lens array in a laser module such that each of said rows of laser elements is essentially permanently precisely aligned with its said corresponding inner lens of said lenticular lens array at the predetermined operating temperature.

38. A semiconductor laser array system which comprises:
a plurality of laser generating elements arranged in essentially parallel rows, each of said laser elements having essentially one laser emitting surface such that said laser emitting surfaces in each row define a substantially line source of laser radiation and the lines of laser radiation define an essentially common plane;
a plurality of substrates, equal in number to the number of rows of said laser elements, each of said substrates supporting one of said rows, with said laser elements thereof positioned essentially along the front edge of their corresponding substrate, the rear face of each substrate being formed with an expanded surface for enabling dissipation of heat, each said substrate including:
a passive portion adapted to provide essentially precise alignment of said laser elements with said corresponding inner lenses;
and
an active portion adapted to provide mechanical support for said laser elements and to provide both heat extraction means and electrical coupling means to enable activation of said laser elements, said active portion comprising:
alternating highly-electrical/highly-thermally conductive diode supporting elements and highly-electrical/highly-thermally insulating elements, the number of said conductive elements being equal to that of said laser elements in each said row mounted to its corresponding substrate, one of said laser elements having one of its top and bottom surfaces mounted directly to one of said conductive elements, and the rear face of all of said conductive elements is provided with the expanded rear surface, and
electrical conductor means connecting each of said conductive elements to the unmounted surface of its next adjacent laser element so that all the laser elements in each row are electrically coupled;

one generally plano-cylindrical inner lens of relatively short focal length for each of said rows of laser elements, each said inner lens positioned in front of and in optical alignment with said line source of its corresponding row of laser elements, with the focal axis of each inner lens essentially parallel to its corresponding row of laser elements and its flat surface essentially parallel to said common plane, each said inner lens having a lens aperture sufficiently wide to capture substantially all laser radiation emitted by its said corresponding row of laser elements and being spaced from said laser emitting surface a distance equal to about its focal length, all of said inner lenses being formed as an essentially one-piece integral lenticular lens array;

a single generally plano-cylindrical outer lens of longer focal length than that of said inner lenses, positioned in front of said inner lenses and in optical alignment with all of said rows of said laser elements, with its focal axis essentially perpendicular to said focal axes of said inner lenses and its flat surface essentially parallel to said common plane, said outer lens having a sufficiently wide lens aperture and being sufficiently long to capture substantially all laser radiation transmitted by said inner lenses and the focal axis of said outer lens being spaced from said laser emitting surface a distance equal to about its focal length;

means for providing sufficient space between adjacent substrates to accommodate one of said rows of laser elements and for essentially isolating said row of laser elements from events occurring generally behind said substrates, said substrates and said lenticular lens array being proportioned and positioned relative to each other such that the laser emitting surface of each of said rows is essentially precisely optically aligned with its corresponding inner lens at its predetermined operating temperature;

a frame for separating said laser emitting surfaces from said lenticular lens array such that the focal axes of said inner lenses are separated from said common plane a distance essentially equal to said focal length of said inner lenses at the predetermined operating temperature;

means for clamping said substrates, said frame, said space-providing means and said lenticular lens array in a laser module such that each of said rows of laser elements is essentially permanently precisely aligned with its said corresponding inner lens of said lenticular lens array at the predetermined operating temperature; and sprayer means coupled to a source of liquid coolant and spaced from the expanded rear surface of said substrates for applying said liquid coolant substantially evenly to the expanded rear surface for maintaining all of said laser elements substantially at the pre-selected operating temperature, said liquid coolant having a generally low heat capacity and a boiling point generally at said pre-selected operating temperature such that when said liquid coolant is applied to said expanded rear surface of said substrate, said lesser elements mounted thereon are maintained substantially at said preselected operating temperature.

* * * * *

UNITED STATES PATENT AND TRADEMARK OFFICE
CERTIFICATE OF CORRECTION

PATENT NO. : 4,306,278

DATED : December 15, 1981

INVENTOR(S) : James T. Fulton and Irwin M. Kaplan

It is certified that error appears in the above—identified patent and that said Letters Patent is hereby corrected as shown below:

Claim 1, Column 16, line 18, insert --its-- before "corresponding".

Claim 2, Column 17, line 8, "an" should read -- a --.

Claim 4, Column 17, line 44, delete "and" after -- with --.

Claim 7, Column 18, line 52, "will" should read -- with --.

Signed and Sealed this

Fourteenth Day of September 1982

[SEAL]

Attest:

GERALD J. MOSSINGHOFF

Attesting Officer — Commissioner of Patents and Trademarks

UNITED STATES PATENT AND TRADEMARK OFFICE
CERTIFICATE OF CORRECTION

PATENT NO. : 4,306,278
DATED : December 15, 1981
INVENTOR(S) : James T. Fulton and Irwin M. Kaplan It is certified that error appears in the above-identified patent and that said Letters Patent is hereby corrected as shown below:

- At column 2, line 61, "know" should read --known--.
- At column 2, line 65, "high" should read --higher--.
- At column 4, line 51, "part" should read --parts--.
- At column 9, line 54, "system" should read --systems--.
- At column 11, line 43, --of-- should be inserted before "its".
- At column 11, line 57, "lenslet" should read --lenselets--.
- At column 11, line 66, --the-- should be inserted after "of".
- At column 13, line 62, "formed" should read --found--.
- At column 14, line 28, "a" should be deleted.

Signed and Sealed this

First Day of March 1983

[SEAL]

Attest:

GERALD J. MOSSINGHOFF

Attesting Officer

Commissioner of Patents and Trademarks